United States Patent
Khoueir et al.

(10) Patent No.: US 9,064,563 B2
(45) Date of Patent: Jun. 23, 2015

(54) OPTIMIZATION OF VARIABLE RESISTANCE MEMORY CELLS

(71) Applicant: Seagate Technology LLC, Cupertino, CA (US)

(72) Inventors: Antoine Khoueir, Apple Valley, MN (US); Mark Allen Gaertner, Vadnais Heights, MN (US); Ryan James Goss, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 167 days.

(21) Appl. No.: 13/762,913

(22) Filed: Feb. 8, 2013

(65) Prior Publication Data

US 2014/0226388 A1 Aug. 14, 2014

(51) Int. Cl.
*G11C 11/00* (2006.01)
*G11C 13/00* (2006.01)

(52) U.S. Cl.
CPC ........ *G11C 13/0004* (2013.01); *G11C 13/0002* (2013.01)

(58) Field of Classification Search
CPC ................. G11C 13/0069; G11C 13/0004
USPC .................................................. 365/148, 163
See application file for complete search history.

(56) References Cited

U.S. PATENT DOCUMENTS

| | | | |
|---|---|---|---|
| 7,191,327 B2 | 3/2007 | Viljoen et al. | |
| 7,295,462 B2 | 11/2007 | Farnworth | |
| 7,506,335 B1 | 3/2009 | Wooff et al. | |
| 7,539,048 B2 | 5/2009 | Farnworth | |
| 7,797,525 B2 | 9/2010 | Lee et al. | |
| 7,873,059 B2 | 1/2011 | Morita et al. | |
| 8,027,207 B2 | 9/2011 | Fifield et al. | |
| 8,028,155 B1 | 9/2011 | Righi et al. | |
| 8,095,851 B2 | 1/2012 | Diggs et al. | |
| 8,159,869 B2 | 4/2012 | Park et al. | |
| 8,199,603 B2 | 6/2012 | Chung et al. | |
| 2003/0172135 A1 | 9/2003 | Bobick et al. | |
| 2009/0168504 A1 | 7/2009 | Lee et al. | |
| 2010/0023870 A1 | 1/2010 | Baker | |
| 2010/0027327 A1 | 2/2010 | Chung et al. | |
| 2010/0027337 A1 | 2/2010 | Park | |
| 2011/0075473 A1 | 3/2011 | Park et al. | |
| 2011/0188292 A1 | 8/2011 | Joo et al. | |
| 2011/0261610 A1 * | 10/2011 | Park | 365/163 |
| 2012/0260159 A1 | 10/2012 | Lazier et al. | |
| 2012/0284230 A1 | 11/2012 | Adkins et al. | |

FOREIGN PATENT DOCUMENTS

| | | |
|---|---|---|
| JP | 2008-276928 A | 11/2008 |
| JP | 2012-094234 A | 5/2012 |
| JP | 2012-099203 A | 5/2012 |
| KR | 10-2010-0013187 | 8/2014 |

OTHER PUBLICATIONS

Lee, et al., "A fast, high-endurance and scalable non-volatile memory device made from asymmetric Ta2O5_x/ TaO2_x bilayer structures,"Nature Materials, Jul. 10, 2011, pp. 1-6, DOI: 10.1038/NMAT3070; Macmillan Publishers Limited.

* cited by examiner

*Primary Examiner* — Huan Hoang
(74) *Attorney, Agent, or Firm* — Hall Estill Attorneys at Law

(57) ABSTRACT

A data storage device may generally be constructed and operated with at least one variable resistance memory cell configured with non-factory operational parameters by a controller. The non-factory operational parameters are assigned in response to an identified variance from a predetermined threshold in at least one variable resistance memory cell.

20 Claims, 5 Drawing Sheets

OPTIMIZATION OF VARIABLE RESISTANCE MEMORY CELLS

SUMMARY

Various embodiments may generally be directed to the management of data storage device having variable resistance memory cells.

In accordance with some embodiments, at least one variable resistance memory cell is configured with non-factory operational parameters by a controller. The non-factory operational parameters are assigned in response to an identified variance from a predetermined threshold in at least one variable resistance memory cell.

DETAILED DESCRIPTION

Many modern data storage devices have begun utilizing solid-state memory cells either alone or in combination with rotating data media to increase data access times and data storage capacity. The use of solid-state memory can provide reduced power consumption, size, heat production, and vibration sensitivity that can allow a data storage device to be implemented in a diverse range of mobile and fixed computing environments. However, added emphasis on the data programming and reading times for solid-state memory can stress structural and operational memory cell conditions that threaten the accuracy and access speed.

One such condition may be resistance variations in memory cells that store data as different resistance states. A deviation of resistance from predetermined thresholds can lead to increased data errors and data access times as memory cells are repeatedly read without confirmation of a stored logical value. While testing, error detection, and error correction codes (ECC) have been proposed, such activities can be costly in terms of processing overhead and temporary memory cell deactivation. Hence, there is a continued industry goal associated with more efficiently managing existing and future errors in data storage devices like those stemming from inadvertent resistance variations.

Accordingly, various embodiments have at least one variable resistance memory cell configured with non-factory operational parameters by a controller, with the non-factory operational parameters being assigned in response to an identified variance from a predetermined threshold in at least one variable resistance memory cell. With a variety of different structural and operational variances between memory cells, the proactive and reactive optimization of a memory cell with non-factory operational parameters allows for cell operation to be customized to the particular memory type, use, and condition. The ability to proactively identify memory cell operational conditions, like resistance variations, can allow efficient management and scheduling of optimization operations that transition a cell from factory to non-factory operating parameters during low system processing times.

Figure 1:
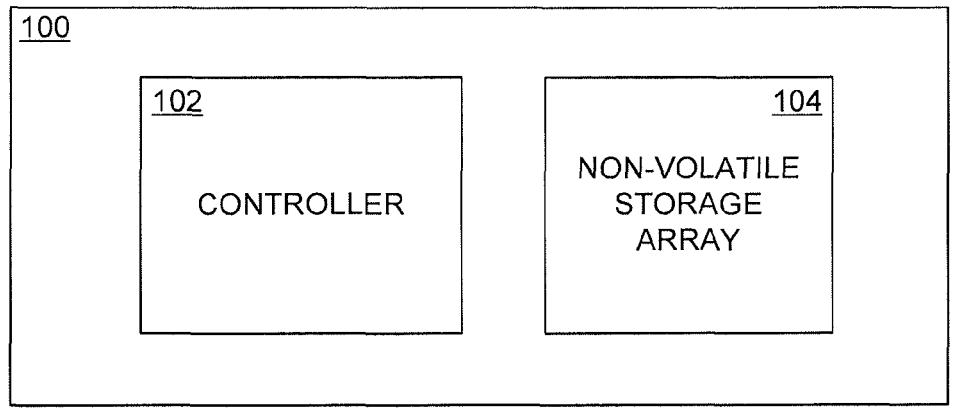
FIG. 1 provides a block representation of a data storage device constructed and operated in accordance with various embodiments.

A variable resistance solid-state memory cell may be utilized and optimized in a variety of non-limiting data storage environments. FIG. 1 provides a block representation of an example data storage device 100 in which various embodiments can be practiced. The device 100, which in some embodiments is configured as a solid-state drive (SSD), has a top level controller 102 and a non-volatile data storage array 104 that may be connected via an unlimited variety of electrical interconnections like wiring, interfaces, busses, and multiplexers. The controller 102 can be used to facilitate the transfer of user data between the storage array 104 and a host device that is internal or external to the storage device 100.

In some embodiments, the controller 102 is a programmable microcontroller that can buffer data in at least one interface circuit pending a transfer between the array 104 and the host device. The position of the controller 102 and storage array 104 are not limited to the concurrent presence illustrated in FIG. 1 as any part of the storage device 100 element may be physically or logically absent while concurrently controlling various operational aspects of the storage device 100. That is, the physical presence of the controller 102 and storage array 104 are not required as either element can be positioned external to the storage device 100, such as across a network accessed with appropriate protocol, while facilitating scheduled and non-scheduled operations within the storage array 104. Similarly, additional controllers and storage arrays may be present internally or externally to the storage device 100 to be selectively utilized, as scheduled and desired.

Figure 2:
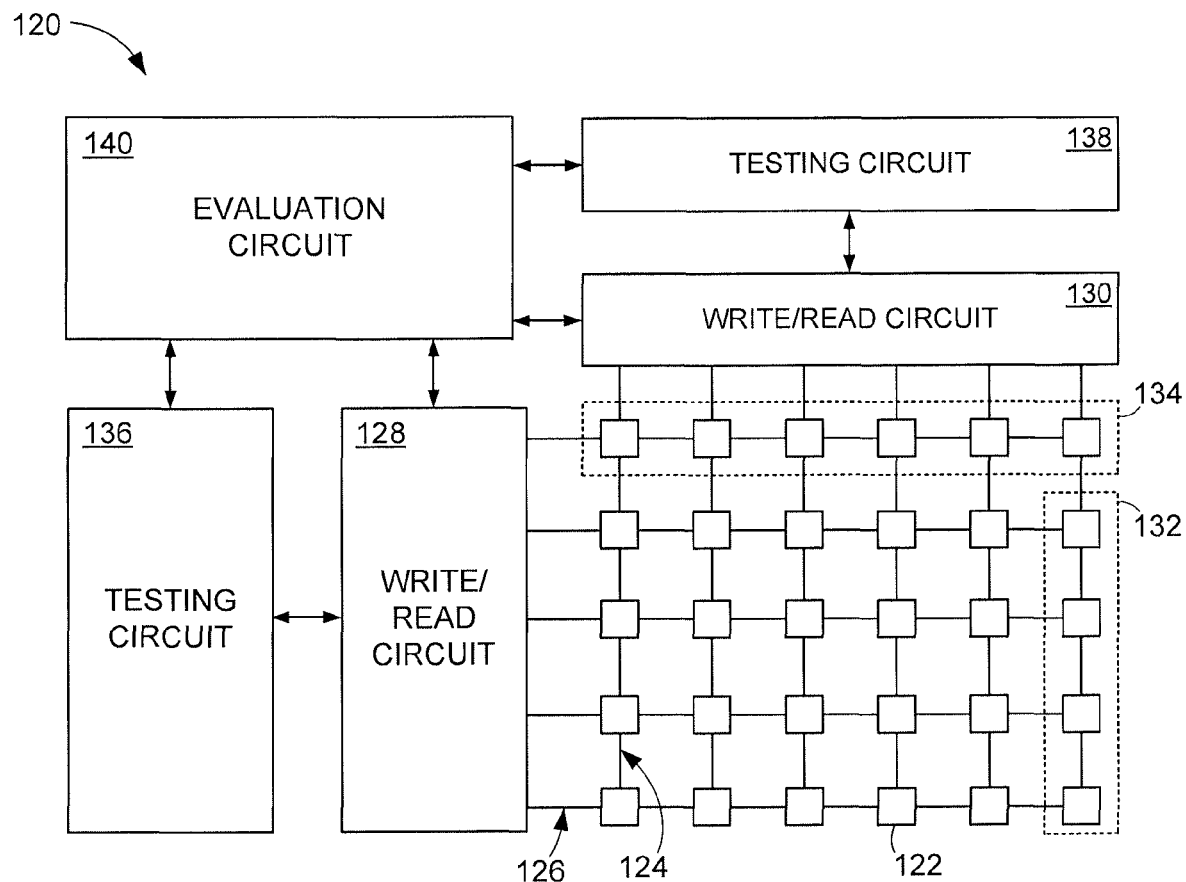
FIG. 2 shows a block representation of a portion of the memory array capable of being used in the data storage device of FIG. 1.

FIG. 2 generally illustrates a block representation of a portion of an example non-volatile storage array 120 that may be used in a data storage device like the device 100 in FIG. 1. A number of non-volatile memory cells 122 are arranged in rows and columns that correspond with the overlapping of electrical paths 124 and 126, such as bit and source lines, in an orientation that can be characterized as a cross-point array. One or more write/read circuits 128 and 130 can individually or concurrently control data being written to and read from selected memory cells 122 arranged in sectors 132, pages 134, blocks, and garbage collection units. Such control may be conducted with respect to multiple cells, such as an entire row, page, and block, singularly or successively to expedite data accesses.

A plurality of memory cells 122 are coupled via control lines 126 to an X (row) write/read circuit 128 and via control lines 124 to a Y (column) write/read circuit 130 that allow for write, rewrite, and read operations to be carried out on a predetermined number of the memory cells 122 either individually or collectively. The write/read circuits 128 and 130 can be configured, in some embodiments, to provide reference parameters, such as voltages, resistances, and pulse widths, that may be catered to more than one type of solid-state memory cell. In other words, different sections of memory, such as different pages 134 or blocks of memory, can be configured physically and logically with different types of memory cells that each operate to store data, but correspond with different reference parameters that are provided by the write/read circuits 128 and 130 to accurately translate a read output or write input into a logic state.

In a non-limiting example operation, the write/read circuits 128 and 130 may concurrently provide access to page 134 or unit 132 of memory cells for scheduled or unscheduled user and overhead system operations. One or more testing circuits 136 and 138 may provide row and column testing capabilities that are monitored, recorded, and evaluated by the evaluation circuit 140. The testing circuits 136 and 138 can be configured to place one or more memory cells 122 and pages 134 of memory in predetermined states, such as in a common logical and resistance values, that may or may not be online for user access in a testing mode characterized by passage of one or more quiescent currents through the selected memory cells 122 to identify and differentiate one or more different types of cell defects, operating parameters, and types of memory. In other words, a single memory cell 122, or more cells concurrently or successively, may be taken offline and set to a testing mode by the testing circuits 136 and 138 to allow a plurality of testing currents to be passed through the cell(s) 122 to determine a variety of biographical, operational, and defective characteristics that are logged and evaluated in the evaluation circuit 140.

As such, the evaluation circuit 140 may direct operation of the testing circuits 136 and 138 as well as write/read 128 and 130 circuits to determine what and how memory cells 122 are operating in the data storage device 120. In some embodiments, the evaluation circuit 140 conducts evaluation and testing of some or all of the memory cells 122 prior to user data ever being written, which can provide baseline factory operating parameters set during manufacturing. Various embodiments further can periodically and sporadically conduct tests and evaluations of the operating characteristics of various memory cells 122. Such periodic testing may be conducted during predetermined and emergency times, such as low system processing and idle times, to identify various operational conditions like resistance variances.

With the ability to test various memory cells 122 and groups of cells 132, the evaluation circuit 140 can adapt to a variety of static and dynamic variations in memory cell performance. However, the reactive correction of operational deviations in tested memory cells can be processing intensive and degrade data accessing speeds. Also, the reactive nature of corrections to memory cell 122 variances may not be conducted soon enough to ensure high data reliability. Thus, the evaluation circuit 140 may be configured with a variety of capabilities to allow for the predictive adaptation of memory cells 122 to operational variances identified through proactive modeling.

Figure 3:
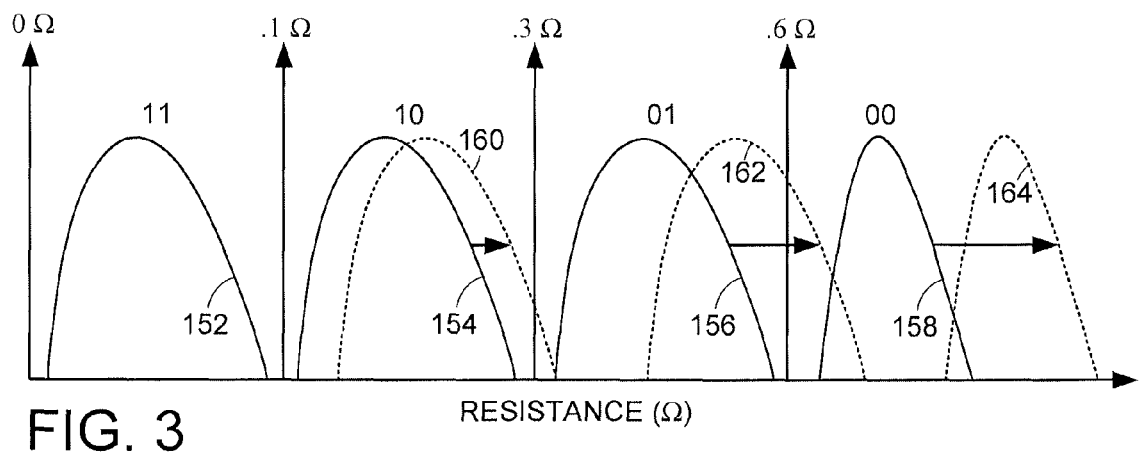
FIG. 3 graphically represents a number of programmed state distributions for an example memory cell.

FIG. 3 plots operational data from an example solid-state memory cell being utilized in a data storage array in accordance with some embodiments. The various resistance regions 152, 154, 156, and 158 respectively correspond to the resistance distributions for a plurality of memory cells programmed to logical values 11, 10, 01, and 00. In some embodiments, one or more solid-state memory cells of a data storage array are configured as a multi-level cell (MLC), which contrasts a single level cell that stores a single bit as either a logical value 0 or 1, by storing n number of bits as 2n logical bit values concurrently, as illustrated in FIG. 3.

While any number of different logical value designations may be utilized without restriction, a logical value convention in accordance with various embodiments assigns a logical value of 11 to the lowest resistance and logical values of 10, 01, and 00 to progressively higher resistances. Regardless of the logical value designations, various memory cell operations can contribute to an inadvertent shift in the resistance of a solid-state memory cell, as displayed by segmented regions 160, 162, and 164. For example but in no way limiting, the number of successive programming cycles of increasing and decreasing the stored resistance of a memory cell, the time a high resistance state has been continually stored in a memory cell, the temperature of a data storage array, and the amount of programming current used to program a memory cell can all contribute to an increase, or decrease, in stable resistance states for a single bit or multi-bit memory cell that increasingly complicate the accurate programming and sensing of data.

A solid-state memory cell can be constructed with materials, layer thicknesses, and overall dimensions conducive to repeatedly providing a plurality of distinct resistances based on a programming current. With the unwanted shift in the stored resistance ranges as illustrated by regions 160, 162, and 164 extending across logical state thresholds, such as $0.3\Omega$ and $0.6\Omega$, logic state accuracy can be tainted as a logical state like 01 can be read as a different state, like 00. Resistance shift may further be exacerbated by attempting to differentiate between stored logical states during a concurrent reading of a page or block of memory cells that contain numerous separate resistances, some of which may have varying degrees of resistance shift.

As the cause for resistance shift is not yet fully understood, prevention of resistance shift has not been reliable. Accordingly, various embodiments are directed to reactive and proactive memory cell optimization that provides the ability to adapt to predicted memory cell variations. Additionally, proactive memory cell optimization can maximize the capabilities of memory cells by altering factory operating parameters, such as resistance thresholds, voltage references, and access pulse widths, to customize the operation of the memory cell to increase the performance of a data storage device.

Figure 4:
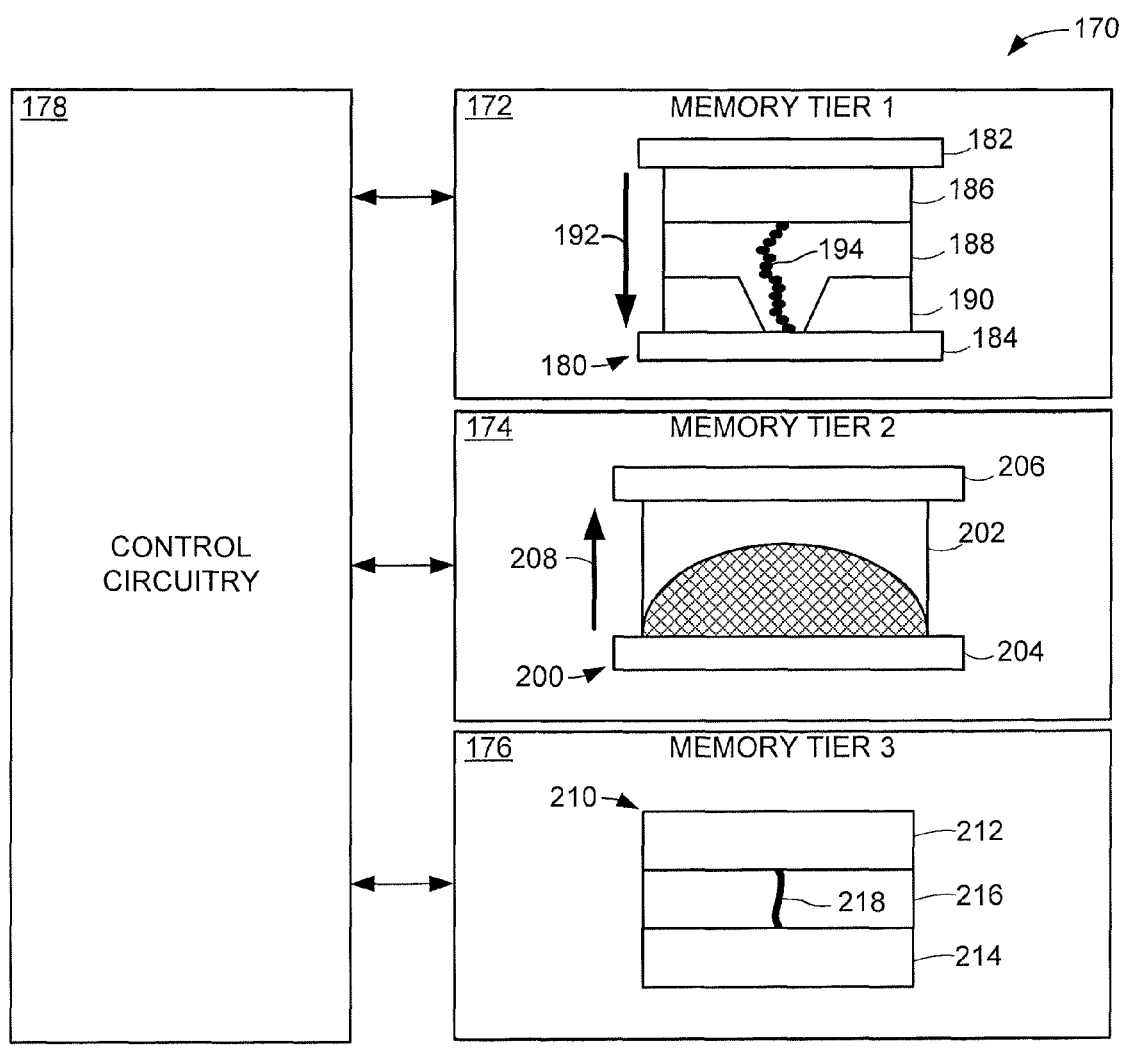
FIG. 4 displays a block representation of an example portion of a data storage device constructed and operated in accordance with some embodiments.

FIG. 4 illustrates a block representation of an example control portion 170 of a data storage device in accordance with various embodiments. The control portion 170 has a plurality of different memory tiers 172, 174, and 176 that are individually and collectively operated through control circuitry 178. In various embodiments, the various memory tiers correspond with different memory cell types. The first memory tier 152 can be constructed and operated with the illustrated programmable metallization cell (PMC) element 180. The PMC element 180 may be formed with top 182 and bottom 184 electrodes, a metal layer 186, an electrolyte layer 188, and a dielectric layer 190. Control circuitry 178 can be used to adjust the relative voltage potential between the first 182 and second 184 electrodes, resulting in passage of a write current 192 through the PMC element 180 to form a filament 194 that changes the resistance of the cell from a high resistance to a low resistance that can correspond to a first predetermined logic state, such as 1.

The filament 194 establishes an electrically conductive path between the metal layer 186 and the bottom electrode 184 by the migration of ions from the metal layer 186 and electrons from the bottom electrode 164. The dielectric layer 190 focuses a small area of electron migration from the bottom electrode 184 in order to control the position of the resulting filament 194. Subsequent application of a write current, in an opposite second direction, through the PMC element 180 causes migration of the ions and electrons back to the respective electrodes 182 and 184 to reset the PMC element 180 to its initial high electrical resistance that corresponds with a different second predetermined logic state, such as 0. PMC elements with a construction similar to that shown at 180 can alternatively be programmed using unipolar programming currents of different magnitudes and/or pulse widths that are selectively provided by the control circuitry 178.

The second memory tier 174 is shown with another non-exclusive type of solid-state memory capable of being used in a data storage array in accordance with various embodiments. The example phase change random access memory (PCRAM) element 200 has a phase change layer 202 disposed between top 204 and bottom 206 electrodes. While not required or limiting, the phase change layer 202 can be formed of a polycrystalline chalcogenide material of group VI of the periodic table, such as Tellurium (Te) and Selenium (Se), while in some embodiments, the phase change layer 202 is formed of $Ge_2Sb_2Te_5$ (GST) or In—Ge—Te.

To place the layer 202 into a relatively high resistance amorphous phase, a fairly high voltage potential is applied across the electrodes 204 and 206 to heat the layer 202 above its melting temperature. The voltage is removed rapidly so as to provide a relatively sharp cooling transition, which may be referred to as a quenching process. In such case, the atoms may not have sufficient time to relax and fully array into a crystalline lattice structure, thereby ending in a metastable amorphous phase and high resistance.

The phase change layer 202 can be programmed to a crystallized phase in response to joule heating caused by the passage of a suitable current 208 of relatively lower magnitude and longer duration through the element 200. The applied pulse is configured to raise the temperature of the layer so as to be above its glass transition temperature and below its melting temperature, and to gradually decrease in temperature back to ambient level. Such temperature gradient will generally provide sufficient dwell time for the material to crystallize. With the programming operation of the PCRAM element 200, data writing currents to place the layer 202 in the respective amorphous and crystalline phases can both be applied in a common direction (uniform polarity) 208, which may provide optimized data programming performance in some data storage arrays.

While the same types of solid-state memory can be used in multiple different memory tiers, the non-limiting embodiment displayed in FIG. 4 has a resistive random access memory (RRAM) element 210 utilized singularly or frequently in the third memory tier 176. The RRAM element 190 has opposing metal or metal alloy electrode layers 212 and 214 that are separated by an intervening oxide layer 216. A first, higher resistance programmed state is established by the nominal electrical resistance of the oxide layer 216. Application of a suitable write voltage potential and/or write current in a selected direction across the element 210 can induce metal migration from the electrode layer 212 and the formation of one or more electrically conductive metallization filaments 218 through the oxide layer 216.

Such filaments 218 generally operate to lower the characteristic resistance of the element 210 and provide different high and low resistance states that can correspond to different logic states. To return the programmed state of the element 210 to a high resistance state, an appropriate write voltage potential and/or current is applied between the electrodes 212 and 214 in a direction that rescinds the filament 218. The creation and subsequent removal of the filament 218 can be less than 10 ns with a 30 µA or less writing current, which may optimize data storage array performance by being implemented alone or in combination with other types of solid-state memory and assigned to operating conditions, such as user data, metadata, and spare cells, that maximize the element's 210 relatively fast programming time and low programming current.

In some embodiments, the oxide layer 216 is configured as a lamination of different materials that can mitigate leakage current and lower programming current. As a non-limiting example, asymmetric $TaO_{2-x}$ and $Ta_2O_{5-x}$ can be have different thicknesses and form the oxide lamination. Such asymmetric oxide lamination can exhibit optimized endurance, data retention, and access speed that is scalable and can be access in a transistorless and diodeless cross-point array, such as the array 120 of FIG. 2.

Various embodiments may also use other resistive memory types, such as nanotube random access memory (NRAM), that employs a non-woven matrix of carbon nanotubes that are moved by Van Der Waal's forces to form high and low resistive states. The size and scalability of NRAM allows the memory to be used in a variety of different memory array applications like a switching device and memory cell. The low access currents associated with reading data from and writing data to further allows NRAM to be utilized individually or in combination with other resistive memory types to provide diverse data storage capabilities for the various memory tiers 172, 174, and 176 of the control portion 170.

The configuration of multiple different memory tiers can allow for the control circuitry 178 to employ sophisticated data management schemes in which the respective memory tiers 172, 174, and 176 have different memory types, like RRAM, PCRAM, and PCM, but similar memory cell functions, such as metadata and storage of user data, which the control circuitry 178 can selectively utilize to optimize data storage performance. For instance, data initially stored in the first memory tier 172 that is constructed as phase change memory cells can be moved for redundancy or relocation to RRAM memory cells of the second memory tier 174.

The ability to control the type of solid-state memory cell data is to be stored in further allows the various memory tiers to be used in an adaptive fashion to reactive and proactively identified memory cell operational deviations, such as resistance variations. However, it should be noted that the use of different types of memory cells may additionally provide cells with different resistances, reading, and writing profiles that correspond with differing tests and predictive models that are concurrently managed by at least the control circuitry 178 to maximize the adaptability of a memory array to variances in cell resistances.

Figure 5:
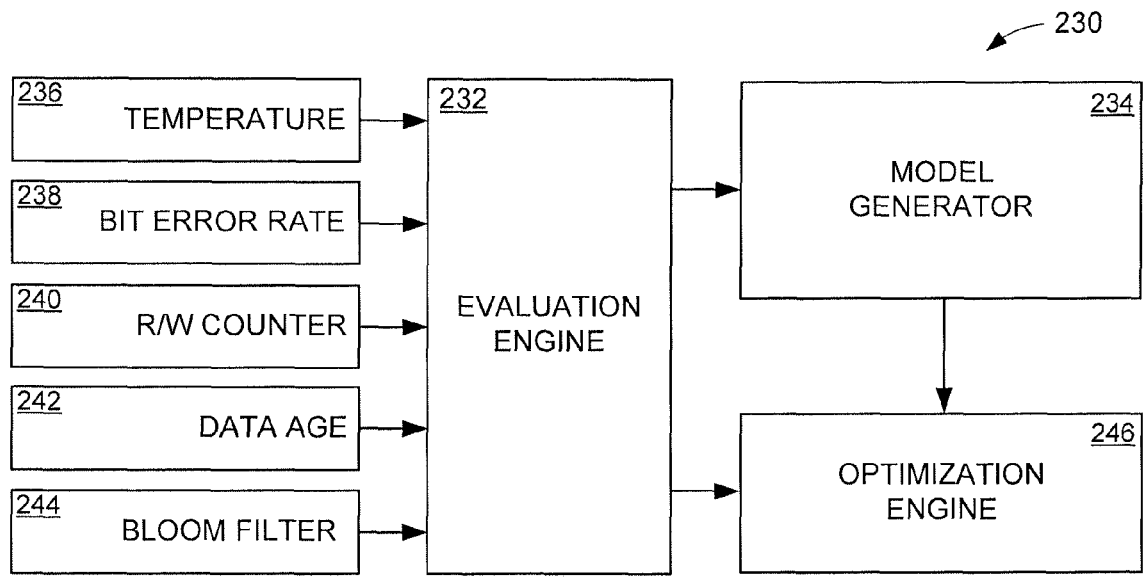
FIG. 5 is a block representation of an example control circuitry portion of a data storage device constructed in accordance with various embodiments.

FIG. 5 provides a block representation of a proactive portion 230 of an example data storage device configured and operated in accordance with various embodiments. An evaluation engine 232 may be separate, like across a wired or wireless network, or integrated within an evaluation circuit like the circuit 140 of FIG. 2. Irrespective of where the evaluation engine 232 is located, a plurality of different types of data may be separately recorded and evaluated by the engine 232 to be passed to a model generator 234 that can process the data and identify probable and imminent memory cell variations, such as resistance, logic state, and access time variations. For example but not limiting, sensors, processing circuits, and timers can provide at least temperature 236, bit error rate 238, read/write counter 240, data age 242, and bloom filter 244 conditions to the evaluation engine 232 for a diverse map of how a data storage array is performing.

One or more temperature sensors 236 can continually and sporadically measure the ambient air temperature of a data storage device as well as the localized temperature of a memory cell, page of memory, and die of memory pages. That is, the air temperature of a device can concurrently or successively lead to the monitoring of individual memory regions to detect particularly hot, or cold, locations. In some embodiments, a threshold temperature, such as 150° F., is set and triggers the investigation of a particular portion of a memory array once the threshold is surpassed. Such investigation may involve taking one or more memory cells offline for testing and predictively changing logic state resistances of cells exposed to temperatures outside a predetermined range. An investigation may result in additional increments may be provided to the read count for one or more memory cells.

A bit error rate (BER) 238 for one or more memory cells may also be monitored by the evaluation engine 232 to predict the physical and logical probability of memory cells that are operating outside of predetermined parameters, like data reliability. For example, a high bit error rate for a memory cell may trigger further investigation or adjustment of cells physically adjacent the identified cell as well as cells logically connected to the identified cell via consecutive data accesses. The bit error rate may be monitored in tiers of memory, such as by blocks and pages, which can result in more efficient analysis as higher BER in higher tiers can subsequently correspond with analysis of fewer cells in lower memory tiers.

Various sectors, pages, blocks, and dies of memory can be continually monitored over an extended time, such as over the life to the data storage device, and for shorter times, such as during the previous hour and week, to provide a read/write counter 240 of the number of data accesses to the evaluation engine 232. Some types of memory and operational conditions, like PCRAM cells being accessed heavily, may be prone to resistance shift, which can be predicted and compensated for in advance. The counter 240 can, in some embodiments, log a multitude of data accesses, like the number of reads, writes, and rewrites, as well as the amount of current being passed through the memory cells to provide data to the evaluation engine 232 and model generator 234 with information on how the various memory cells are being accessed.

While counters may monitor accesses to one or more memory cells, an age counter 242 can operate to record the overall amount of time that has passed since a memory cell was written, read, and changed. Through various environmental and operational memory cell conditions, such as read disturb and undiscovered localized heating and trauma, the relocation of data can proactively improve the accuracy of data storage. The age counter 242 can be complemented by the measured and estimated bit error rate 258 and read/write counter 240 to provide a comprehensive memory cell map that allows the evaluation engine 232 and model generator 234 to create long-range and precise operational models predicting when and which memory cells will deviate from predetermined operational thresholds like resistance states.

A bloom filter 244 can be used to provide a weighted factor approach to track the data from the temperature 236, read/write counter 240, and data age counter 242 and provide the evaluation engine 232 with data that can efficiently be utilized by the model generator 234 to construct memory cell operational predictions. In some embodiments, a weighted factoring may provide an adjusted read count such as:

$$\text{Count(Adj)} = \text{Actual Reads} + K1(\text{Temp}) + K2(\text{Age}) + K3(\text{Delta-}V) \quad (1)$$

where Count(Adj) is an adjusted count value, Actual Reads represents an actual read operation, Temp is a temperature reading/range/zone, Age represents aging of the block, and Delta-V represents detected or predicted changes in cell resistance during a data access operation. Aging can be tracked in a variety of ways with module 242, such as in relation to a total number of writes and/or reads upon the selected memory location. The delta-V value can be utilized responsive to the application of different read voltage and resistance thresholds. It will be appreciated that other factors may be used.

The creation of accurate operation models via the model generator 234 can allow for an unlimited variety of proactive measures to be taken to optimize data storage device performance. One such proactive action may be sending testing data from the evaluation engine 232 and predicted operational data from the model generator 234 to an optimization engine 246 that subsequently customizes factory operational parameters to non-factory operational parameters, as generally illustrated in the block representation of example memory cell optimization logic 250 in FIG. 6.

Figure 6:
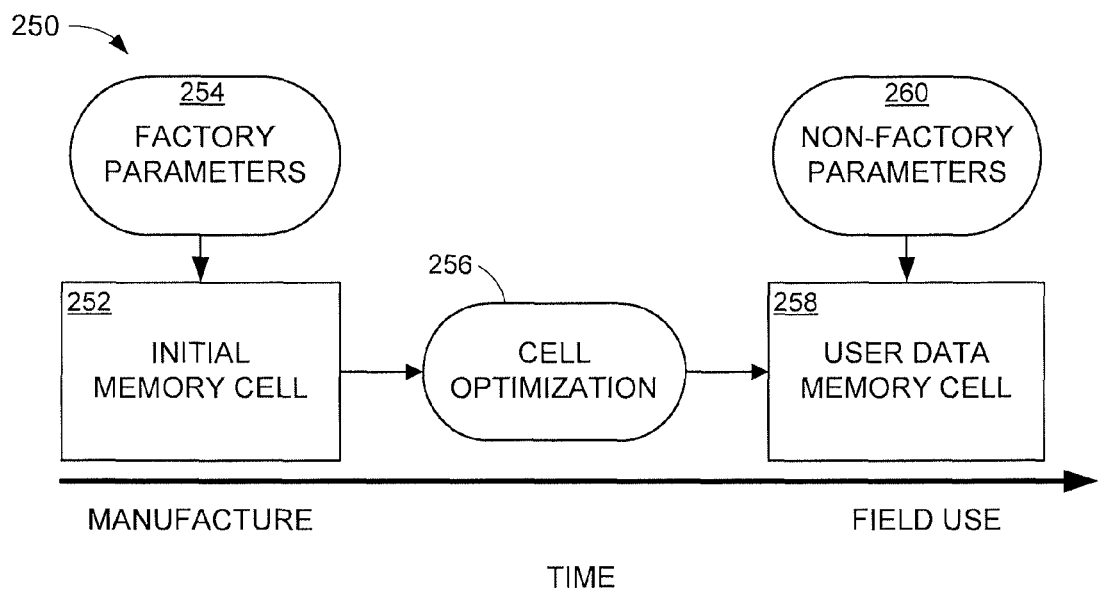
FIG. 6 provides a block representation of example memory cell optimization conducted in accordance with some embodiments.

As displayed in FIG. 6, an initial memory cell 252 can be manufactured with factory parameters 254 that may encompass the number of bits stored, resistance thresholds between logic states, programming voltages, programming pulse widths, and reading reference voltages. Such factory parameters 254, and an unlimited variety of other operational parameters, can be stored locally in the form of metadata and in various other locations, like a look-up table that instructs control circuitry, such as testing and write/read circuits, how to read and write data to the memory cell 252.

Through cell optimization 256 operations, the initial memory cell 252 can be configured into a user data memory cell 258 that has non-factory parameters 260 guiding various data reading and writing operations. It should be noted that the non-factory parameters 260 are not required to change each factory operating parameter 254 and can alter as little as one operating characteristic to fulfill the customization associated with cell optimization 256. The non-factory parameters 260 can provide a plethora of optimized operating conditions for the user data memory cell 258 such as repair of degraded performance, upgrading a single bit cell to a multi-bit cell, and catering logic thresholds to increase data access reliability and speed.

In some embodiments, the cell optimization 256 occurs after the user data memory cell 258 has engaged in field use with data from an end-user being locally stored. Other embodiments conduct the cell optimization 256 both before and after the user data memory cell 258 is engaged in field use. Regardless of when and how many times the cell optimization 256 is conducted, the alteration of factory parameters 254 into customized non-factory parameters can provide the ability to maximize the potential of the user data memory cell 258 and cater the performance of the memory cell 258 to predetermined data storage characteristics, such as increased data reliability and fast data access.

Figure 7:
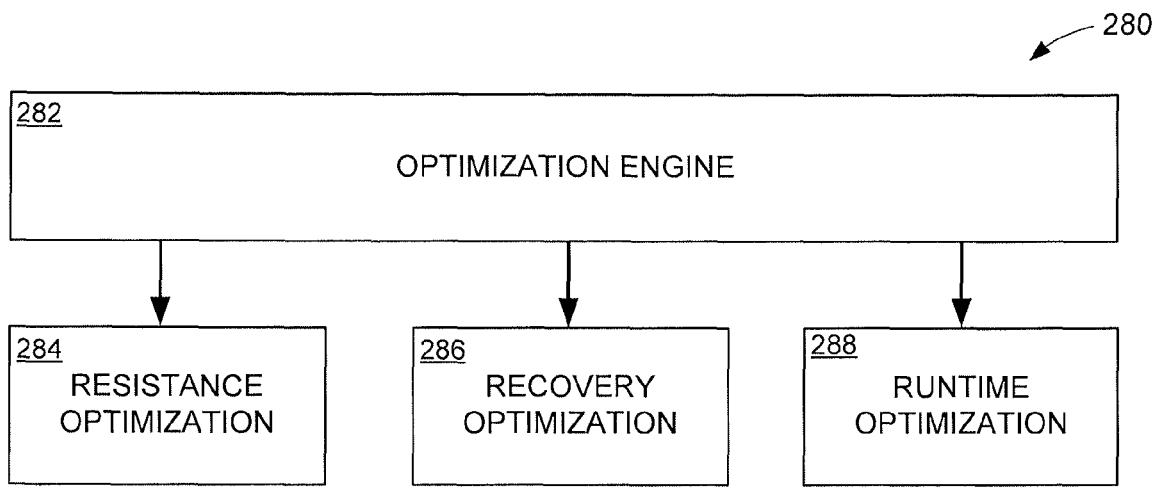
FIG. 7 displays a block representation of an example control circuitry constructed and operated in accordance with various embodiments.

The cell optimization 256 may be conducted by the optimization engine 246 of FIG. 5 that receives both testing data from the evaluation engine 232 and prediction models from the model generator 234. However, the optimization engine 246 may encompass a number of sub-systems dedicated to carrying out specific, but not exclusive, cell optimizations. FIG. 7 displays an example optimization portion 280 of control circuitry integrated into a data storage device in some embodiments. The optimization portion 280 can be directed by one or more optimization circuits 282 that evaluate testing and prediction data to provide resistance optimization 284, recovery optimization 286, and runtime optimization 288 to tune non-factory operational parameters for one or more memory cell.

The resistance optimization 284 may alter the resistance thresholds and reference voltages for reading and programming operations to adapt to current or predicted memory cell operational parameter variances. Various embodiments configure the resistance optimization 284 to alter the resistance thresholds and reference voltages for memory cells not identified as deviating from predetermined operational thresholds. That is, the resistance optimization 284 may alter memory cells that have been identified as deviated from predetermined thresholds as well as memory cells that are operating within the predetermined thresholds. This ability to optimize the resistance of memory cells regardless of operating status can allow for memory array operation that adapts to changing memory cell conditions and maximizes the potential of at least one memory cell in the memory array.

Figure 8:
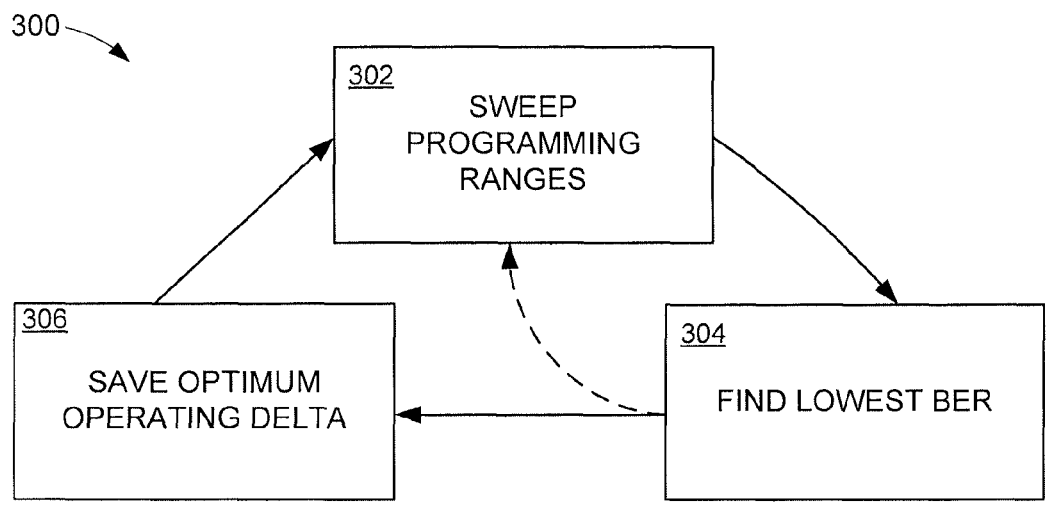
FIG. 8 shows a logic map of an example optimization routine carried out in accordance with some embodiments.

An example programming voltage optimization loop 300 is provided in FIG. 8 and begins with the sweeping of programming ranges in step 302. Such a programming range sweep can involve the testing and evaluation of a single memory cell, page of cells, and block of pages that may or may not have deviated from predetermined operational thresholds. The sweep of step 302 may correspond with a diverse number of programming voltages applied to various memory cells and subsequently tested for bit error rate (BER) in step 304. The identification of the lowest bit error rate may correspond with a programming voltage modification in step 302 and voltage verification in step 304 to verify the BER associated with the voltage range.

While the optimization loop 300 is directed towards programming voltages, read voltages may similarly be tested to find the lowest BER. As a result of either programming or reading voltage optimization as part of the resistance optimization 284, factory operational settings like voltages corresponding to different resistance logic states can be optimized for the lowest BER whether the memory cell has been identified with currently or future deviation from predetermined operational parameters. For example, a first memory cell that is predicted to undergo resistance shift and a second memory cell that is following factory operational parameters can have their respective programming and reading voltages optimized to accommodate the change in resistance states in the first cell while maximizing the potential of the second cell.

As another non-limiting example, the optimization loop 300 can progressively reduce programming voltage ranges through steps 302 and 304 to find the lowest BER with respect to a predetermined data access speed. Such activity can allow the optimization loop 300 to alter the resistance, programming voltage, and reading voltage for at least one memory cell to optimize the speed at which data can be accessed while retaining high data accuracy. The ability to use the optimization loop 300 to alter memory cells despite operating according to factory specifications can tailor portions of a memory array, such as individual memory tiers containing a single type of solid-state memory, to maximize operating conditions for specific memory cell operations like faster read speeds and multi-bit cell assignment.

For clarity, the optimization engine 282 and resistance optimization 284 of FIG. 7 can utilize the optimization loop 300 to evaluate portions of a memory array to alter factory operating parameters of active, non-defective memory cells to non-factory operating parameters that are tuned and optimized for predetermined performance characteristics. As such, the optimization loop 300 can test and verify reading and programming parameters for a variety of different operating conditions, like data reading speed, to take advantage of one or memory cells being capable of reliably operating outside of the factory provided specifications.

With the alteration of resistance information for one or more memory cells through steps 302 and 304, the resultant optimized non-factory operating delta from factory specifications is stored in step 306. In some embodiments, step 306 can temporarily save non-factory operating deltas from a plurality of different memory cells and subsequently storing the respective deltas in cell overhead, such as metadata and page/block look-up tables, when system processing is minimized and system capabilities would not be diminished by the data transition of the various deltas.

Returning to FIG. 7, the optimization engine 282 may conduct recovery optimization 286 individually or collectively with other optimization schemes. Recovery optimization 286 can provide tuned non-factory operating parameters by altering the operating conditions of the memory cell itself. In contrast to the resistance optimization 284 that tunes non-factory specifications in response to memory cell capabilities, recovery optimization 286 actually alters the operating parameters of the memory cell by passing recovery currents with predetermined pulse width and amplitude through the cell to produce temporary or permanent.

While recovery optimization 286 may be capable of returning a memory cell experiencing resistance shift to factory specified operating conditions, various embodiments go farther and optimize the performance of the memory cell, which may be conducted with the testing and verification of operating ranges shown in FIG. 8. The recovery optimization 286 can allow a memory cell to be physically altered to conform to predetermined performance parameters. For instance, a PCRAM memory cell can be tuned with one or more optimization currents to have higher or lower data read and write voltages through the creation of a semi-amorphous state in the memory cell, which can correspond with non-factory resistance states and reference pulse durations.

The ability to proactively predict the operating conditions of one or more memory cells can allow resistance and recovery optimization 284 and 286 to tune non-factory operating parameters with higher accuracy and precision as testing and verification can be scheduled and conducted to derive the non-factor operating parameters. Moreover, repeatedly conducting optimization operations, like optimization loop 300, on progressively smaller amounts of memory cells can provide die, block, page, and sector trends that can be more macroscopically utilized to optimize memory array performance.

Figure 9:
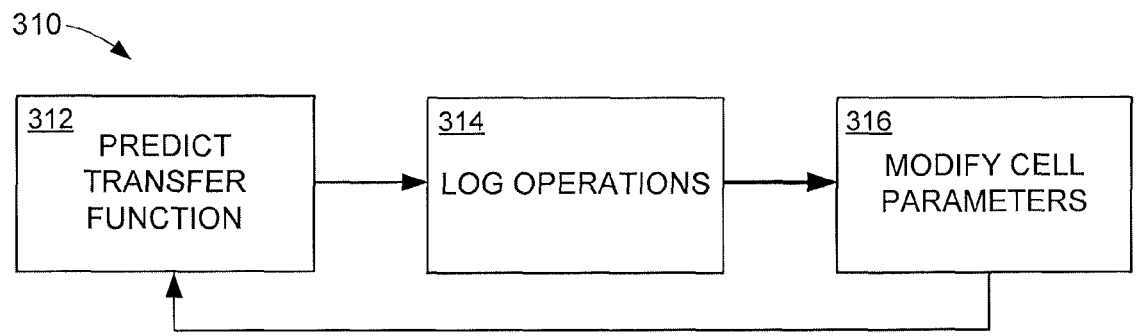
FIG. 9 displays a logic map of an example optimization routine conducted in accordance with various embodiments.

FIG. 9 provides a runtime optimization loop 310 that may correspond to the runtime optimization 288 of FIG. 7. The runtime optimization loop 310 can be continually conducted on portions of a memory array to tune one or more operating parameters, such as voltage, current, temperature, and time, with respect to current or projected resistance of a memory cell. As shown, step 312 predicts transfer function between operating parameters of interest that are subsequently logged in step 314. An accumulation of logged operations trending or passing a predetermined threshold triggers step 316 to modify the operating parameters of a memory cell with minimal testing and verification operations.

The relatively low processing associated with steps 312, 314, and 316 can allow a plurality if runtime optimization loops 310 to be active concurrently to produce a variety of specific and general operating conditions that can be utilized by the optimization engine 282 to cater array performance to experienced and projected user activity. It should be noted that step 312 is not limited to using predicted transfer functions as transfer functions based on logged memory array activity can be utilized in a reactive manner, such as linear and time-based systems.

The adaptability of the various optimization schemes 284, 286, and 288 to time, processing availability, and memory cell conditions illustrates the diverse capabilities provided by the optimization engine 282. By computing existing memory cell activity and condition with projected models of memory cell operational changes can provide a powerful arsenal of data that can be harnessed by the optimization engine 282 to tune memory cells in a variety of manners, such as programming voltage and upgrading to multi-bit memory cell, to maximize the potential of the memory array.

Figure 10:
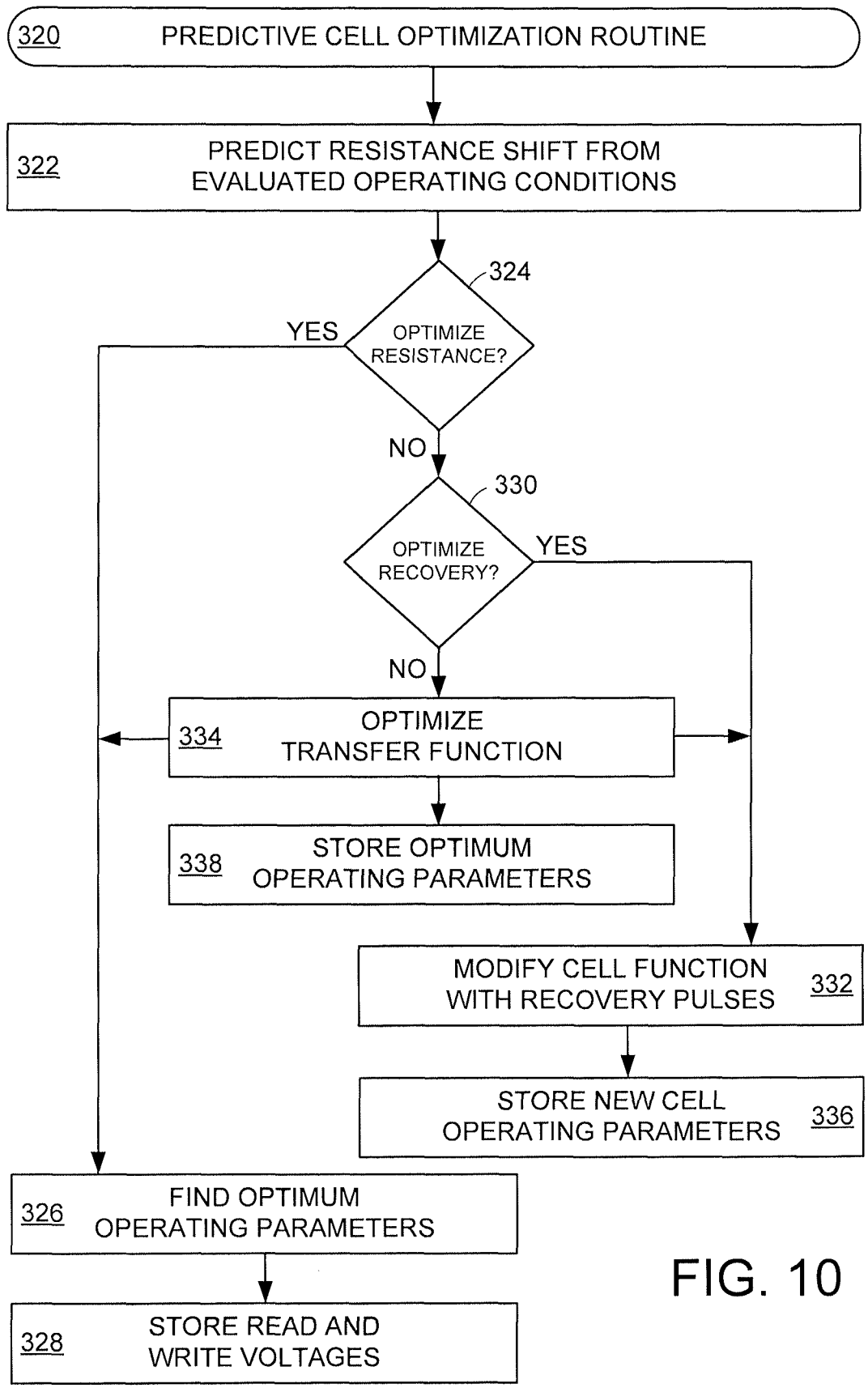
FIG. 10 illustrates an example proactive memory cell management routine carried out in accordance with some embodiments.

FIG. 10 provides a logical map of an example predictive cell optimization routine 320 carried out in accordance with some embodiments. Initially, a prediction of a resistance shift based on evaluated operating conditions is produced in step 322. Such prediction can correspond with a variety of processed data, such as temperature, bit error rate, and data access counters, as well as modeling of future memory array activity Step 322 may involve the evaluation of logged operational and testing data concerning one or more memory cells to identify future deviations in resistance for cells that currently have not deviated from predetermined resistance thresholds. The identification of deviations may be based on past evaluations and tests of defective cells or may be based on identified trends that suggest cell deviation from predetermined threshold.

A predicted resistance shift from step 322 can proceed to decision 324 where a determination is made whether or not to optimize the resistance of one or more memory cells predicted to deviate from a predetermined resistance range. Decision 324 may evaluate whether a memory cell is better served by tuning non-factory operating parameters to suit the condition of the cell or by tuning the cell to different operating characteristics. In the event the factory operating parameters are to be tuned without alteration of the operation of the memory cell, step 326 generates optimum operating parameters, such as resistance thresholds, read voltage, and programming current, for one or more memory cells according to predetermined tables and observed operational data that may be produced by the evaluation engine, model generator, and optimization engine. The new non-factory operating parameters are then stored at least as updated read and write reference voltages that correspond to resistance states of the optimized memory cell. The updating of memory cell operational data, like ECC and forward pointers, can be stored collectively in a look-up table as well as in overhead cells like biographical metadata cells.

Either at the conclusion of step 328 or if no resistance optimization is chosen in decision 324, decision 330 determines whether or not to tune the operation and operating parameters of selected memory cells. A determination that memory cell function is to be changed either to repair current or projected resistance deviation or to optimize memory cell performance, step 332 modifies memory cell function with recovery pulses of predetermined width and duration to temporarily or permanently alter the resistance, voltage, and current associated with reading and writing data to the memory cell.

Alternatively, step 334 predicts or utilizes an existing transfer function to evaluate memory cell operation in real-time and optimize non-factory operating parameters for the memory cell. The result of memory cell optimization from step 334 may be the alteration of memory cell function in step 332 and/or alteration of operating parameters in step 326. The storage of the updated non-factory operating parameters from step 334, which may include alterations by steps 332 and/or 326, is conducted in step 338.

It can be appreciated from the various steps and decisions of routine 320 that one or more memory cells can be tuned from factory to non-factory operating parameters to optimize memory cell performance. However, that the various steps and decisions of routine 320 shown in FIG. 10 are not required or limited as the various decisions and steps can be omitted, changed, and added, at will. As an example, an additional decision can be evaluated prior to step 332 to determine what kind of recovery pulse is to be used, such as high current amplitude and duration pulse verses low current amplitude, long duration pulse.

With the tuned non-factory operating parameters, performance of a memory array can be optimized with respect to general characteristics, like data reading accuracy, as well as memory cell specific characteristics, like multi-bit resistance thresholds. The ability to utilize observed memory array performance with projected operating models allows for memory cell optimization that is both reactive and proactive to provide memory array adaptability to memory cell deviations and user activity. Moreover, the proactive and reactive evaluation of memory cells can allow the utilization and optimization of multiple different types of solid-state memory with differently tuned non-factory operating parameters that maximize the diverse operating advantages of each memory type.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. An apparatus comprising at least one non-defective variable resistance memory cell connected to an optimization circuit and a controller, the optimization circuit configured to set the at least one variable resistance memory cell with non-factory operational parameters as directed by the controller, the non-factory operational parameters being outside factory provided specifications and assigned in response to a non-defective predicted variance from a predetermined threshold in at least one variable non-defective resistance memory cell.

2. The apparatus of claim 1, wherein the non-factory operational parameters differ from factory operational parameters associated with the at least one variable non-defective resistance memory cell prior to the storage of user data.

3. The apparatus of claim 1, wherein the factory operational parameters are present in a first type of variable non-defective resistance memory cell and the non-factory operational parameters are present in a second type of variable non-defective resistance memory cell.

4. The apparatus of claim 3, wherein a first type of variable non-defective resistance memory cell comprises a programmable metallization cell.

5. The apparatus of claim 4, wherein a second type of variable non-defective resistance memory cell comprises a phase change random access memory cell.

6. The apparatus of claim 5, wherein a third type of variable non-defective resistance memory cell comprises a resistive random access memory cell.

7. The apparatus of claim 1, wherein the controller comprises an evaluation engine configured to concurrently analyze a plurality of different memory cell operational conditions to reactively identify variance from the predetermined threshold.

8. The apparatus of claim 7, wherein the evaluation engine provides a model generator with data to proactively identify variance from the predetermined threshold.

9. The apparatus of claim 8, wherein the identified variance from the predetermined threshold corresponds with the at least one variable non-defective resistance memory cell complying with the predetermined threshold.

10. A method comprising predicting a variance from a predetermined threshold in at least one variable non-defective resistance memory cell and assigning non-factory operational parameters to the at least one variable non-defective resistance memory cell with an optimization engine portion of a controller in response to the predicted variance from the predetermined threshold, the non-factory operational parameters being outside factory provided specifications.

11. The method of claim 10, wherein the non-factory operational parameters are a programming voltage and a read voltage.

12. The method of claim 10, wherein the optimization engine generates the non-factory operating parameters proactively.

13. The method of claim 10, wherein the optimization engine generates the non-factory operating parameters reactively.

14. The method of claim 10, wherein the non-factory operating parameters modify the factory operating parameters based on a predicted transfer function.

15. The method of claim 10, wherein the non-factory operating parameters modify the factory operating parameters in relation to an observed bit rate error.

16. The method of claim 10, wherein the optimization engine sweeps a plurality of different reference voltages through the at least one variable non-defective resistance memory cell to produce the non-factory operating parameter.

17. A method comprising predicting a variance from a predetermined threshold in a first non-defective variable resistance memory cell and assigning a first non-factory operational parameters to the first non-defective variable resistance memory cell with an optimization circuit connected to a controller in response to the predicted variance from the predetermined threshold, the non-factor operational parameters being outside factory provided specifications.

18. The method of claim 17, wherein the first non-defective variable resistance memory cell is functionally altered by a recovery current and the first non-factory operational parameters correspond to the altered memory cell function.

19. The method of claim 18, wherein the first non-defective variable resistance memory cell has an altered data programming voltage as a result of the recovery current.

20. The method of claim 18, wherein a second non-defective variable resistance memory cell is altered by the recovery current to have second non-factory operational parameters, different from the first non-factory operational parameters, the second non-defective variable resistance memory cell being physically adjacent the first non-defective variable resistance memory cell and not varying from the predetermined threshold.

* * * * *